United States Patent
Huang et al.

(10) Patent No.: US 6,675,472 B1
(45) Date of Patent: Jan. 13, 2004

(54) PROCESS AND STRUCTURE FOR MANUFACTURING PLASTIC CHIP CARRIER

(75) Inventors: Edward Huang, Tao-Yuan (TW); Jonny Ma, Tax-Yuan (TW); Scott Chen, Tao-Yuan (TW); Paul Wu, Saratoga, CA (US)

(73) Assignee: Unicap Electronics Industrial Corporation, Hsien (TW)

( * ) Notice: Subject to any disclaimer, the term of this patent is extended or adjusted under 35 U.S.C. 154(b) by 0 days.

(21) Appl. No.: 09/548,671

(22) Filed: Apr. 13, 2000

(Under 37 CFR 1.47)

Related U.S. Application Data (60) Provisional application No. 60/131,492, filed on Apr. 29, 1999.

(51) Int. Cl.⁷ .................................................. H01K 3/10
(52) U.S. Cl. .......................... 29/852; 29/846; 427/97; 427/99; 427/259; 451/29
(58) Field of Search .................... 29/825, 830, 831, 29/846, 852; 427/97, 99, 259; 83/14; 451/29–31

(56) References Cited

U.S. PATENT DOCUMENTS

| | | | |
|---|---|---|---|
| 3,401,126 A | 9/1968 | Miller et al. | 252/514 |
| 3,429,040 A | 2/1969 | Miller | 29/626 |
| 3,436,818 A | 4/1969 | Merrin et al. | 29/626 |
| 3,564,522 A | 2/1971 | Stevens, Jr. | 340/174.1 |
| 3,949,125 A | 4/1976 | Roberts | 428/99 |
| 4,229,248 A | 10/1980 | Silverman et al. | 156/653 |
| 4,462,534 A | 7/1984 | Bitaillou et al. | 228/180 |
| 4,504,283 A | 3/1985 | Charvat | 51/298 |
| 4,546,541 A | 10/1985 | Reid | 29/603 |
| 4,579,806 A | 4/1986 | Schupp et al. | 430/280 |
| 4,761,699 A | 8/1988 | Ainslie et al. | 360/103 |
| 4,790,894 A * | 12/1988 | Homma et al. | 156/250 |
| 4,818,728 A | 4/1989 | Rai et al. | 437/209 |
| 4,825,284 A | 4/1989 | Soga et al. | 347/80 |
| 4,864,471 A | 9/1989 | Hargasser et al. | 361/417 |
| 4,929,469 A * | 5/1990 | Kimura et al. | 427/511 |
| 4,996,623 A | 2/1991 | Erpelding et al. | 360/104 |
| 4,999,699 A | 3/1991 | Christie et al. | 357/65 |
| 5,121,190 A | 6/1992 | Hsiao et al. | 357/80 |
| 5,128,746 A | 7/1992 | Pennisi et al. | 357/72 |
| 5,334,857 A | 8/1994 | Mennitt et al. | 257/48 |
| 5,378,859 A | 1/1995 | Shirasaki et al. | 174/261 |
| 5,499,446 A * | 3/1996 | Murakami | 29/852 |
| 5,574,629 A | 11/1996 | Sullivan | 361/767 |
| 6,365,979 B1 * | 4/2002 | Miyajima | 257/787 |

FOREIGN PATENT DOCUMENTS

| | | |
|---|---|---|
| JP | 59-125642 A | 7/1984 |
| JP | 60-35545 A | 2/1985 |
| JP | 9-74151 A | 3/1997 |

\* cited by examiner

*Primary Examiner*—Richard Chang
(74) *Attorney, Agent, or Firm*—Jim Zegeer (57) ABSTRACT

A process for forming a burrless castellation for a plastic chip carrier comprising forming one or more through holes in a substrate, plating the through holes with a metal to a thickness ranging from about 2 microns to about 6 microns, routing slots along the line extending through the through holes to produce half cylinder-shaped side-contact surfaces, and plating the half cylinder-shaped side-contact surfaces to a thickness in the range of 15 to 25 microns.

8 Claims, 6 Drawing Sheets

PROCESS AND STRUCTURE FOR MANUFACTURING PLASTIC CHIP CARRIER

REFERENCE TO RELATED APPLICATION

This application is based on provisional Application No. 60/131,492 filed Apr. 29, 1999 entitled BURRLESS CASTELLATION (SEMI-CYLINDER VIA) PROCESS AND STRUCTURE FOR PLASTIC CHIP CARRIER.

FIELD OF THE INVENTION

This invention relates to a new and improved castellation via process which can prevent causing "short circuit" and/or "open circuit" problems due to burrs and dust particles generated in the traditional manufacturing processes.

DESCRIPTION OF THE PRIOR ART

Traditionally, Leadless Chip Carrier is manufactured with ceramic materials and processes, at very high cost. In order to reduce cost, plastic chip carrier was developed as a replacement for the ceramic leadless chip carrier, whereas the cost saving is around 3 to 1 reduction. Note that one essential aspect for the new plastic carrier 220 to be a functioning replacement of its ceramic predecessor is the capability to provide high quality structure and surface finish in the half-cylinder shaped (castellation) side contact pins 135, which are made by routing out one-half of a full-cylinder plated through hole. But the prior art in manufacturing such plastic chip carrier is prone to the phenomenon of "burr" 310, which causes many problems including open circuit and short circuit immediately after fabrication and during the useful life cycle of the product.

THE PRESENT INVENTION

The object of the present invention is to provide a new and improved castellation via process which can prevent causing short circuit and open circuit problems due to burrs and dust particles generated in the traditional manufacturing process. According to the invention, burrs and dust particles are eliminated or minimized in the process of manufacturing leadless semiconductor chip carriers which include copper plating the carrier substrate to form a copper plated chip carrier substrate and wherein the routing of one or more slots in the copper plated chip carrier substrate. The improvement comprises preventing burrs wherein the copper plating is performed prior to making the routing of one or more slots by a thin plating in a thickness range of about 2 microns to about 6 microns. Subsequent to routing of the slots, the copper is thickened by plating to a thickness of the final thickness range, preferably in the range of 15 to 25 microns. In a further aspect of the process, a protective coating layer, such as an ultraviolet (UV) curable ink is applied after the thin copper plating. The UV curable ink layer provides protection for the thin copper layer during routing and is stripped off or removed after routing. The UV coating layer provides backing support and prevents the thin copper from being pulled off and forming burrs during routing.

This results in a leadless semiconductor chip carrier having copper plating on a substrate and one or more machine routings formed through the copper plating and substrate wherein the improvement lies in the copper plating being comprised of a first thin copper layer (having a thickness range of about 2 to 6 microns) and applied prior to the machine routings. At least one thicker copper layer is applied after the machine routing so that the thickness of the copper plating is preferably in the range of from about 15 microns to about 25 microns.

DESCRIPTION OF THE DRAWINGS

The above and other objects, advantages and features of the invention will become more apparent when considered with the following specification and accompanying drawings wherein.

DETAILED DESCRIPTION OF THE INVENTION

A closer look at the prior art demonstrates the reasons for the prior art shortcomings discussed above. A prior art process follows the typical steps of:

1. Drilling holes 110.
2. Plating PTH (Plated Through Holes) and copper 140. Define circuitry by etching copper 125 and 140 in non-circuitry areas.
3. Applying solder mask 170.
4. Plating Ni/Au 160 (Nickel/Gold).
5. Routing the slots 210,
6. Laminating the supporting board such as Flame Retardant type 4 (FR4) or Bismaleimide Triazine (BT) 120 material.
7. Final route 210.

Figure 12:
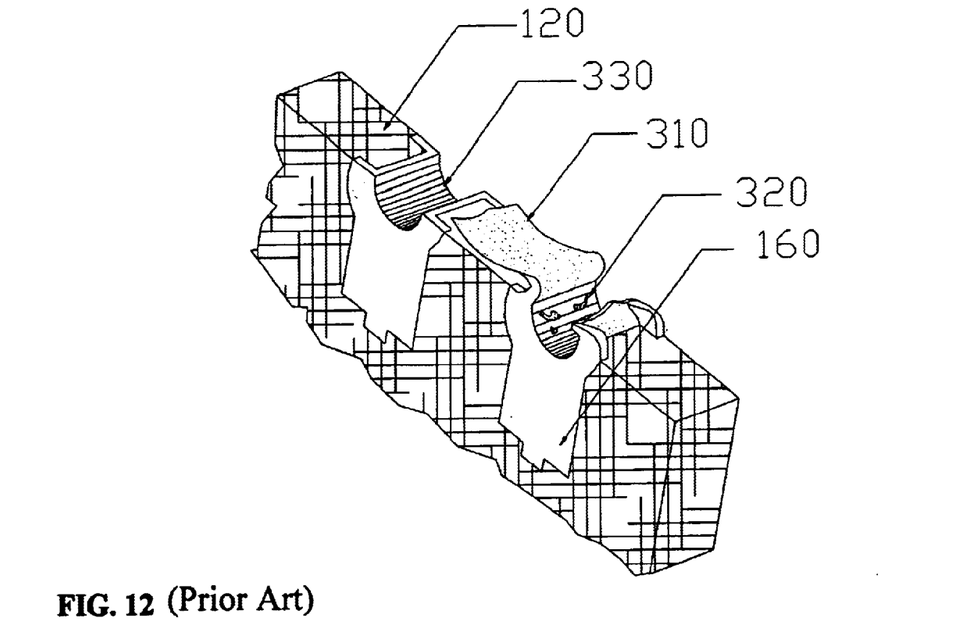
FIG. 12 is a view of prior art illustrating some of the defects in prior art processes.

During step 5, which is to route the opening slots 210 for forming the semi-circles (they are semi-cylinders in 3-dimensional view), severe burrs 310 and powder dust particles 320 occur (see FIG. 12). It is known that metallic burrs 310 result in short circuit and the plastic powder dust particles 320, which block the holes 110, result in open circuit when the side contacts in the finished product are clamped on.

In addition, even if there are no burrs, on the side wall, the copper layer is exposed due to the routing process. The copper/nickel/gold layers can also be pulled off by the routing bit and become lifted or loosened from the laminated side wall. Both phenomena are reliability concerns during the operation life of the product.

The root cause of the burrs 310 and the dust particles 320 is due to the fact that the thick copper/nickel/gold metal layers 125, 140, 150, and 160 are very resilient and cannot be easily broken off by the routing process.

In this invention, a new process for manufacturing such side contacts 330 is developed, in which no burrs and power dust particles are generated or are minimized and thus alleviating all problems mentioned above.

The Present Invention

The following describes preferred process step sequence, though variations can be adopted by the skilled in the art of Printed Circuit Board (PCB) and High Density Interconnect (HDI) fabrications, some of which are suggested below:

1. Drill holes 110 (hole size is around 0.5 mm, typical range can be from 0.25 mm to 1 mm) in the core 120 (BT material, with thickness around 0.4 mm, though any desired thickness ranging from 0.2 mm to 1 mm can be used and is not a critical parameter).
2. Thin-plate PTH 130 (Plated Through Holes) and copper with thickness preferably ranging from about 2 microns to about 6 microns, with a preferred thickness of about 5 microns.
3. Pre-etch copper, resulting in circuitry pattern in high density and near-slot edge area 135.
4. Route the slots 210 to produce the inner half-cylinder shaped side contact surface.
5. Full-plate the PTH and the copper 140 to its final thickness (in the range of about 15 microns to about 25 microns, with a preferred thickness of 20 microns).
6. Define nickel/gold area 150–160 with dry-film openings in the non-high-density area while keeping the high-density or edge areas completely open and plate nickel/gold with electrolytic-plating method, where nickel 150 is around 5 microns (with a range of about 3 to about 7 microns) thick and gold is around about 0.75 micron (with a range of about 0.5 to about 1micron) thick. In other words, nickel/gold is plated over i) edge area, ii) high-density area, and iii) circuitry in non-high-density area. Only the non-circuitry portion of the non-high-density area remains bare copper, to serve as conduit for plating buss connection during electrolytic nickel/gold plating.
7. Etch copper in non-high-density circuit area using gold 160 as mask.
8. Laminate supporting board (FR4 or BT material 120).
9. Final route.

Note that in this exemplary process, solder mask 170 is not used. In applications where solder mask 170 is needed as a protective layer for non-gold surface area, either one of the following two options can be adapted:

(a) modify step 7 by using dry-film-mask to protect copper area in addition to the natural gold-mask 160, then etch out plating buss area and follow with an additional solder mask 170 print and opening step, resulting in complete covering of any copper surface, or (b) simply add a solder mask 170 step after step 7, if non-nickel/gold copper-area 130–140 is not needed.

Taking modification option a) will result in the following process steps:

1. Drill holes 110.
2. Thin-plating PTH 130 and copper with thickness ranging from about 2 microns to 6 about microns.
3. Pre-etch copper circuitry pattern in high density or near-slot edge area 135.
4. Route the slots.
5. Full-plate the PTH and the copper 140 to its final thickness (about 15 microns to about 25 microns).
6. Define nickel/gold area 150–160 with dry-film openings in the non-high-density area while keeping the high-density or edge areas completely open and plate nickel/gold 150–160 with electrolytic-plating method.
7. Dry-film cover copper areas to be retained and etch copper; (while in the high-density area or near the edge, using nickel/gold 150–160 as the natural etch mask).
8. Apply solder mask 170 to protect areas not to be exposed; solder mask thickness is around about 20 microns to about 30 microns, though thicker solder mask for up to 50 microns can also be used.
9. Laminate supporting board (FR4 or BT material)
10. Final route.

Taking modification option (b) will result in the following process steps:

1. Drill holes 110.
2. Thin-plating PTH 130 (plated through holes) and copper with thickness ranging from about 2 microns to about 6 microns.
3. Pre-etch copper circuitry pattern in high density or near-slot edge area 135.
4. Route the slots 210.
5. Full-plate the PTH and the copper 140 to its final thickness (about 15 microns to about 25 microns).
6. Define nickel/gold area 150–160 with dry-film openings in the non-high-density area while keeping the high-density or edge areas completely open and plate nickel/gold 150–160 with electrolytic-plating method.
7. Etch copper in non-high-density circuit area using gold 160 as mask.
8. Apply solder mask 170 to protect areas not to be exposed; solder mask 170 thickness is around about 20 microns to about 30 microns, though thicker solder mask 170 for up to 50 microns can also be used.
9. Laminate supporting board (FR4 or BT 120 material).
10. Final route.

A More Refined Process Sequence for Further Reduction of Burrs

To further reduce burrs, we add two more steps to the original process.

3.1) Plug the PTH with Ultra-Violet (UV) curable ink by applying the ink into the holes and curing it with UV light.

4.1) Strip off the UV curable ink that covers the inner surface of the PTH (the half that remains after routing the slots 210) with NaOH (Sodium Hydroxide) stripper. Note that step 3.1 is to be done after step 3 in all variations of the process and step 4.1 is to be done after step 4, respectively.

Even though the additional steps add to process time and cost, it further reduces the possibility of burrs 310, because the UV curable ink covers the thin copper during routing and prevents the copper 125, 130, and 140 from being lifted. Though UV curable ink is cited as an example for plugging the PTH walls, other materials and mechanisms that can be applied before routing and stripped off after routing can be used.

While the invention has been described in relation to preferred embodiments of the invention, it will be appreciated that other embodiments, adaptations and modifications of the invention will be apparent to those skilled in the art.

What is claimed is:

1. In a process for manufacturing a leadless semiconductor chip carrier which includes providing a carrier substrate having a plurality of routable holes, plating said routable holes to form plated through holes in said chip carrier substrate, and, routing one or more slots in said holes to form half-cylinder shaped contacts in the side wall of said chip carrier substrate, the improvement for preventing burrs comprising said conductive metal plating is performed (a) prior to making said routing one or more slots by a thin conductive metal plating with a thickness in the range of about 2 microns to about 6 microns and (b) subsequent to routing of said slots, thickening said conductive metal plating to a final thickness.

2. The process defined in claim 1 wherein said conductive metal is copper and said final thickness is in the range of between about 15 microns to about 25 microns.

3. In a process for further preventing burrs in the process defined in claim 1, whereby a UV curable ink coating layer is applied after the thin conductive metal plating and pattern etching, used as a protection for the thin conductive metal plating during routing, and stripped off after said routing, whereby said coating layer provides backing support and prevents the thin copper from being pulled off.

4. The process defined in claim 3 wherein said conductive metal is copper and said final thickness is in the range of between about 15 microns to about 25 microns.

5. The process for forming a burrless castellation for a plastic chip carrier comprising forming one or more through holes in a substrate, plating said through holes with a metal to a thickness ranging from about 2 microns to about 6 microns, route slots along the line extending through said through holes to produce half-cylinder-shaped side-contact surfaces, and full metal plating said half cylinder-shaped side-contact surfaces to a thickness in the range of 15 to 25 microns.

6. The process defined in claim 5 wherein said conductive metal is copper and the first said plating thickness is about 5 microns.

7. The process defined in claim 5 wherein said conductive metal is copper and said final thickness is about 20 microns.

8. The process defined in claim 6 wherein said the final thickness is about 20 microns.

* * * * *

UNITED STATES PATENT AND TRADEMARK OFFICE
CERTIFICATE OF CORRECTION

PATENT NO. : 6,675,472 B1
DATED : January 13, 2004
INVENTOR(S) : Edward Huang et al.

Figure 1:
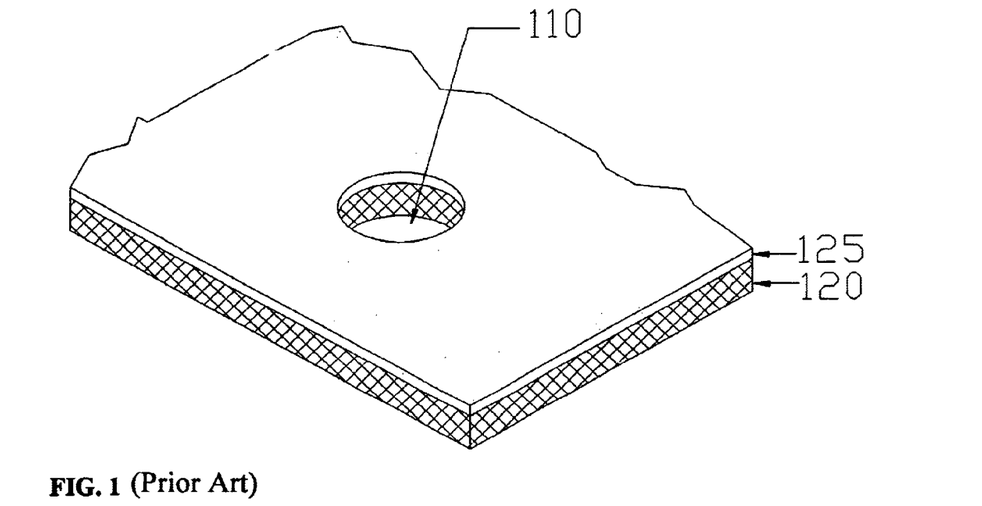
FIG. 1 is an isometric view of a substrate core material with drill holes therein.
Figure 2:
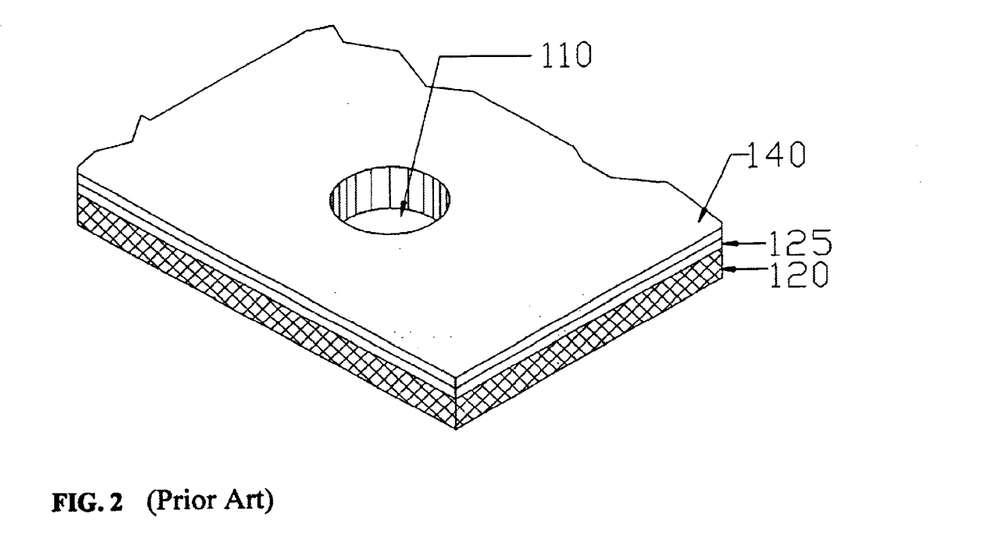
FIG. 2 is an isometric view of the substrate with copper coating layers thereon.
Figure 3:
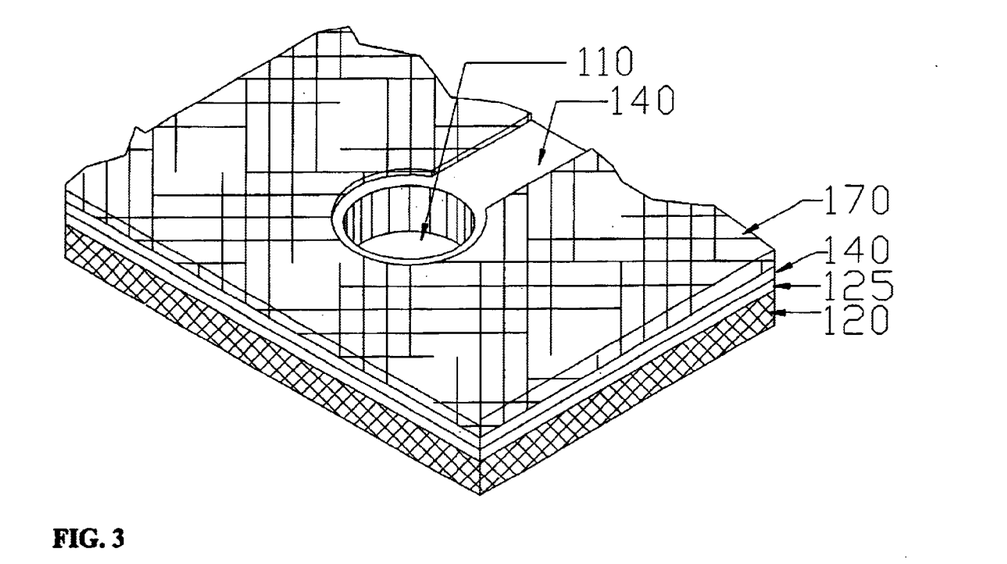
FIG. 3 is an isometric view of the substrate in which the solder mask layer has been applied.
Figure 4:
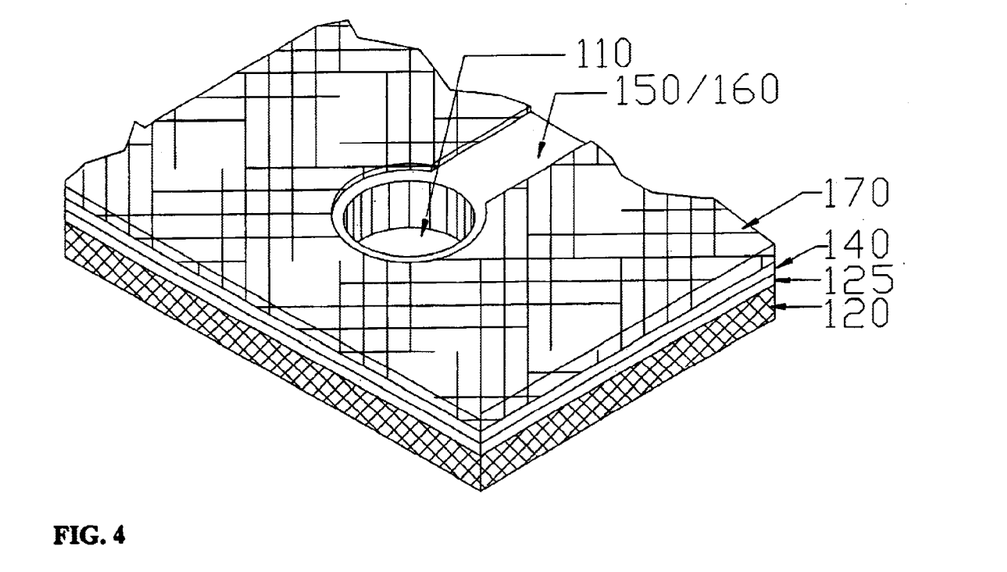
FIG. 4 is an isometric view showing nickel/gold area with dry film openings.
Figure 5:
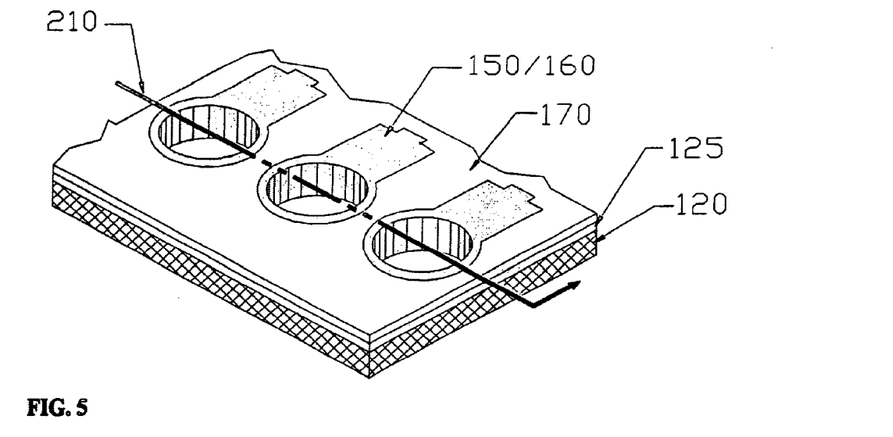
FIG. 5 is an isometric view showing a line for the routing slots.
Figure 6A:
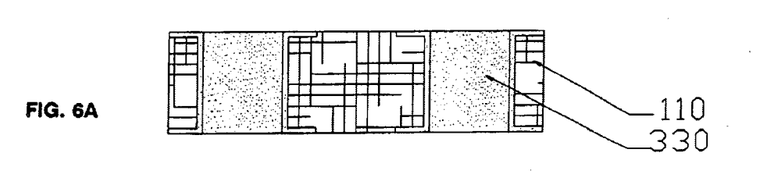
FIGS. 6A and 6B are sectional and top views along the sectional lines for a routing line of FIG. 5.
Figure 6B:
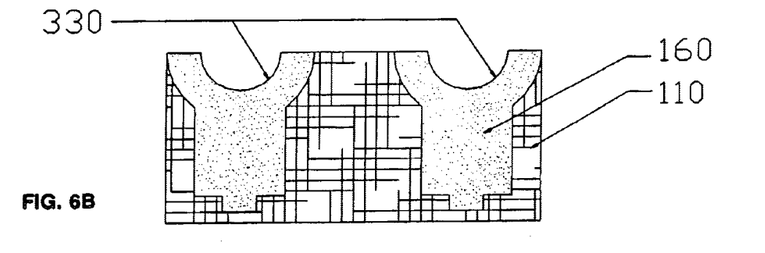
Figure 7:
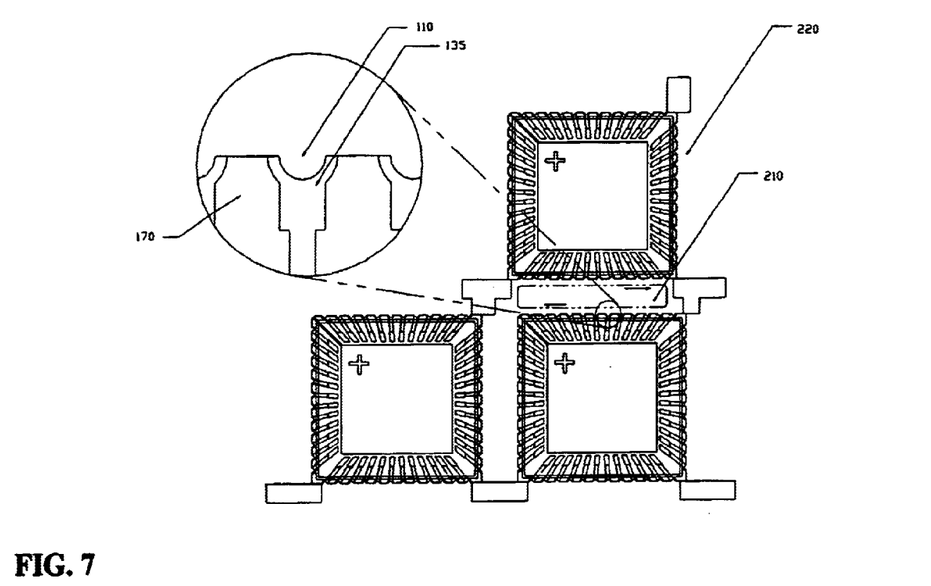
FIG. 7 is an illustration showing a plurality of plastic chip carriers incorporating the invention.
Figure 8:
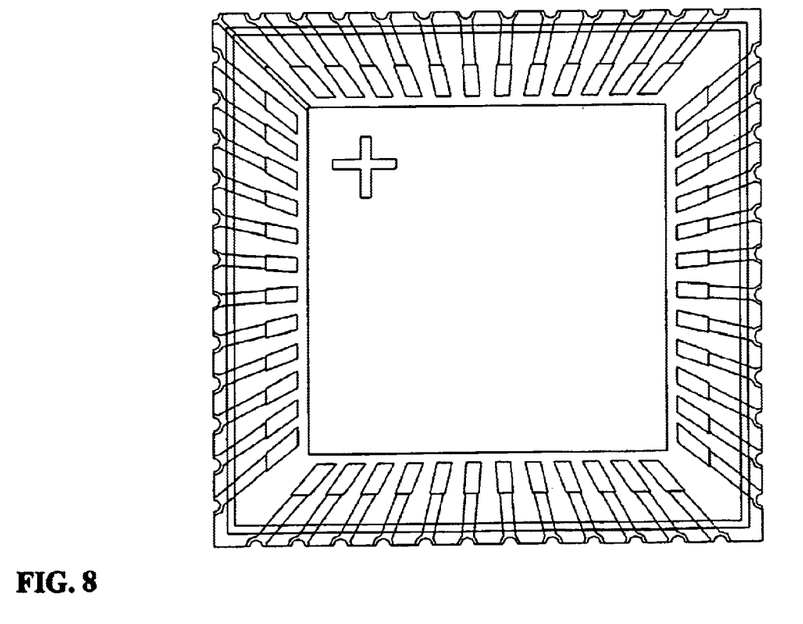
FIG. 8 is a top view of one plastic chip carrier substrate incorporating the invention.
Figure 9:
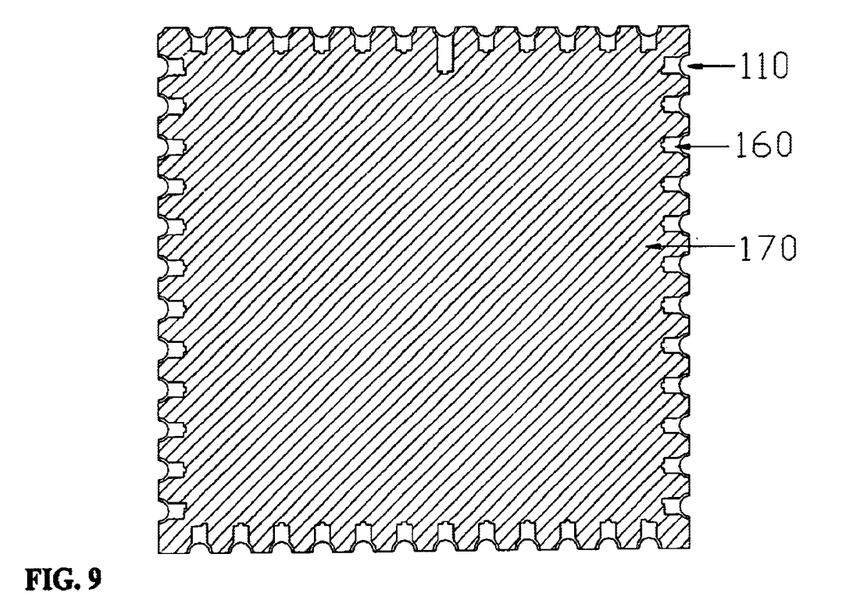
FIG. 9 is a bottom plan view of the substrate.
Figure 10:
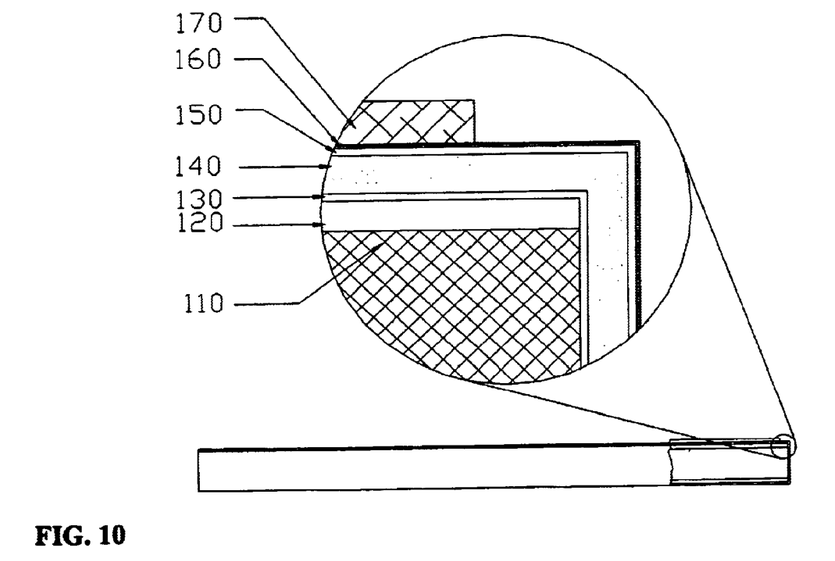
FIG. 10 is a diagrammatic illustration of a sectional profile of the corner of the structure incorporating the invention.
Figure 11:
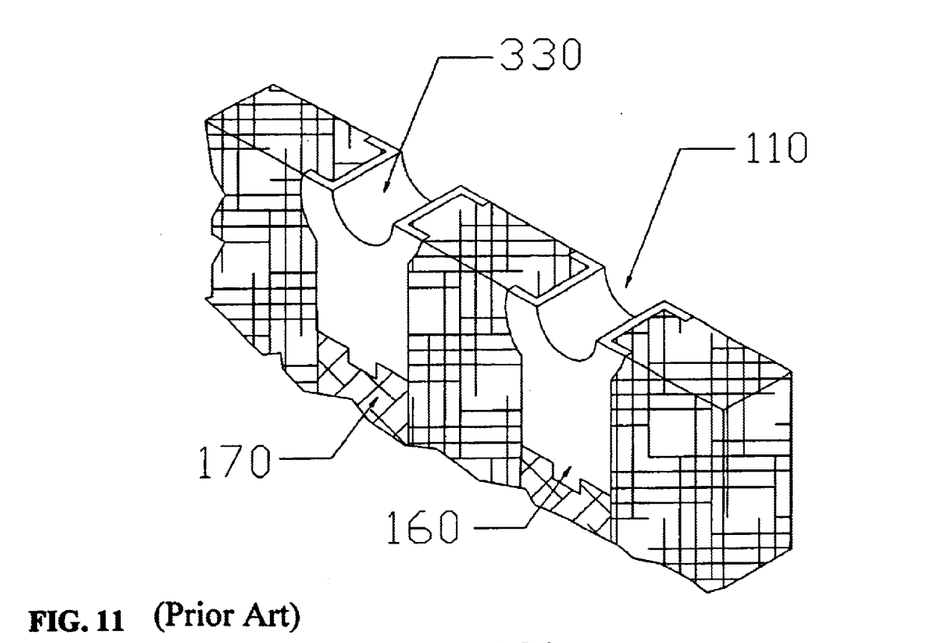
FIG. 11 is an isometric view of a portion of a castellated chip carrier incorporating the invention.

It is certified that error appears in the above-identified patent and that said Letters Patent is hereby corrected as shown below:

Drawings,
FIG. 11, please remove the phrase "(Prior art)".

Signed and Sealed this

Seventh Day of September, 2004

JON W. DUDAS
*Director of the United States Patent and Trademark Office*